United States Patent [19]

Imai et al.

[11] 4,042,955
[45] Aug. 16, 1977

[54] RESIN-SEALED ELECTRICAL DEVICE

[75] Inventors: Takeshi Imai, Oobu; Tsutomu Niwa, Kariya; Kenji Motani, Kagoshima, all of Japan

[73] Assignee: Nippondenso Co., Ltd., Kariya, Japan

[21] Appl. No.: 668,813

[22] Filed: Mar. 22, 1976

Related U.S. Application Data

[63] Continuation of Ser. No. 480,580, June 18, 1974, abandoned.

[30] Foreign Application Priority Data

June 22, 1973 Japan ................................. 48-70917

[51] Int. Cl.² ...................... H01L 23/28; H01L 23/30; H01L 23/36
[52] U.S. Cl. ......................................... 357/72; 357/73; 357/78; 174/52 PE
[58] Field of Search ........................ 357/72, 73, 78, 79; 174/52 PE

[56] References Cited

U.S. PATENT DOCUMENTS

| 2,572,801 | 10/1951 | Casellini | 357/72 |
| 2,877,392 | 3/1959 | Koets et al. | 357/72 |
| 3,789,275 | 1/1974 | Sawano | 357/72 |

FOREIGN PATENT DOCUMENTS

| 1,352,429 | 1/1964 | France | 357/73 |
| 956,001 | 4/1964 | United Kingdom | 357/73 |

Primary Examiner—Andrew J. James
Attorney, Agent, or Firm—Cushman, Darby & Cushman

[57] ABSTRACT

Electrical elements constituting an electrical device are embedded into at least one layer of a finely divided insulating material which is formed within a case by filling the case with the insulating material. A low viscosity resin is poured into the case to be impregnated into said at least one layer of the insulating material and to form a cover layer covering the free surface of the top insulating cover layer. The resistances to moisture, vapor, shocks, vibration, cycling temperature change and so on are remarkably improved so that the highly reliable performances of the enclosed electrical device under severe environmental conditions may be ensured.

3 Claims, 6 Drawing Figures

RESIN-SEALED ELECTRICAL DEVICE

This is a continuation, of application Ser. No. 480,580 filed June 18, 1974 now abandoned.

BACKGROUND OF THE INVENTION

The present invention relates to electrical device of motor bicycles, snow mobiles, or other industrial machinery which are sealed with resins so that they may be satisfactorily used under severe environmental conditions such as vibrations and cycling change in temperature over a very wide range (hereinafter referred to as cycling temperature change).

Hitherto, in order to protect the electrical devices from the severe environments, especially from vibrations, moisture and vapor, and cycling temperature change, they are sealed or enclosed with highly flexible resins such as epoxy resins, urethane resins, and so on. However, when a flexible resin in used in order to protect the electrical devices at low temperatures, the resistance to heat is not satisfactory. On the other hand, when a resin which is satisfactorily resistant to heat is used, its resistance to low temperature is not satisfactory. That is, the resistance to heat and the resistance to low temperature are incompatible with each other. In order to overcome this problem, a mixture consisting of a flexible resin and an insulating material has been used to seal or enclose electrical devices so that the coefficient of thermal expansion may be minimized. However, when an insulating material is mixed into a resin, the viscosity of the mixture is increased so that the electrical device cannot be completely set and sealed with the mixture. Thus, the use of such mixture cannot attain the satisfactory sealing effects of the electrical devices in practice.

The present invention was therefore made in order to solve the above and other problems encountered in the prior art techniques. One of the objects of the present invention is to provide resin-sealed electrical devices which may satisfactorily function even when they are subjected to severe cycling temperature change, vibrations and high humidity. In the present invention, an electrical device is not sealed with a mixture consisting of a resin and an insulating material, but is sealed by being embedded in one or more layers of the insulatng material among the particles of which sinks into a resin of low-viscosity. However, the grain size of the insulating compounds to be used must not be too coarse or too fine. When the grain size is too fine, it becomes very difficult to impregnate a resin from the top surface of an insulating material layer and as a result the impregnation time becomes inevitably longer. On the other hand, if the grain size is too coarse, the impregnated resin does not come short of the electrical elements constituting an electrical component. Therefore, when the electrical device is subjected to cycling temperature change cracks occur. It is of course easy to impregnate a resin into a layer of an insulating material of a coarse grain size. However, the grain size of the insulating material must be determined so that the desired electrical characteristics and performance of the resin-sealed electrical devices may be maintained.

Briefly stated, the present invention provides a resin sealed electrical device comprising an electrical element, a case for housing said electrical device therein, a layer of an insulating compound such as finely divided quartz ($SiO_2$), magnesium oxide (MgO), lead oxide (PbO), borosilicate soda glass or rubber so that said electrical component may be embedded in said layer, and a cover layer consisting of a resin of low viscosity formed over said first mentioned layer, said resin of low viscosity being impregnated into said first mentioned layer.

According to one aspect of the present invention, an electrical component is embedded into a layer of a finely divided insulating material charged into a case, and a resin of low viscosity is poured into the case so that it may be impregnated into the insulating material layer and may form a cover layer over the free surface of the insulating material layer. Therefore, the resistance to moisture and vapor of the electrical device may be considerably improved, so that the deterioration of the electrical characteristics may be well prevented. Furthermore, the commercial value of the electrical device may be remarkably increased. Moreover, the performance of the electrical device sealed with resin in accordance with the present invention is very satisfactory under very severe environmental conditions; no crack is started; and the desired electrical characteristics may be maintained. According to another aspect of the present invention, the particles of different sizes of an insulating component are used so that a plurality of insulating material layers of different grain size ranges may be formed. Therefore, the impregnation of a resin of low viscosity is readily accomplished within a short time, so that the fabrication efficiency of the electrical device may be much improved.

The above and other objects, features and advantages of the present invention will become more apparent from the following description of some preferred embodiments and examples thereof in conjunction with the accompanying drawings.

FIRST EMBODIMENT, FIGS. 1 - 3

Figure 1:
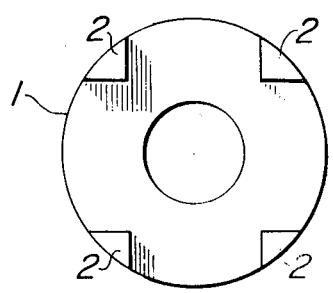
FIGS. 1 and 2 are a schematic top and a sectional view of a conventional testing washer which is shown as an example of electrical elements constituting an electrical component according to the present invention.
Figure 2:
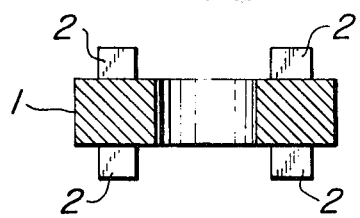
Figure 3:
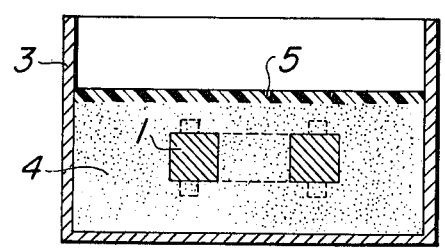
FIG. 3 is a sectional view of the washer shown in FIGS. 1 and 2 and sealed with a resin in accordance with the present invention.

The first embodiment of the present invention will be described in conjunction with a sample, i.e., a conventional "Olyphant" washer generally designated by 1 in FIGS. 1 - 3. The washer 1 (9 mm in diameter and 6.5 mm in height) has eight projections 2 (2.5 mm in height) protruded from both surfaces thereof. The washer 1 is embedded into a layer of an electrical insulating material 4 charged into an aluminum case 3 (50 mm in diameter and 30 mm in depth) as shown in FIG. 3. A resin of a low viscosity (whose viscosity is less than 1500$^{CP}$ at room temperature) is directly impregnated into the layer 4 and is poured into the aluminum case 3 so that a cover layer 5 whose thickness is thinner than that of the insulating material layer 4 may be formed over the free surface of the layer 4.

Next some examples obtained by the above described method will be described.

EXAMPLE 1

Finely divided quartz $SiO_2$ was used as an insulating material. The degree of impregnation depending upon the grain sizes of resins of low viscosity and the appearance of the samples after they were subjected to the cycling temperature change tests were investigated. The results are shown in Tables 1 and 2.

sium oxide MgO, ferric oxide $Fe_2O_3$, lead oxide PbO, hollow borosilicate soda glass and rubber which have the same average grain size as the above-mentioned were also tested. The degree of impregnation as well as the results of the cycling temperature change tests were better.

EXAMPLE 2

The upper and lower layers of finely divided quartz $SiO_2$ of different grain sizes were formed in the case so that electrical elements were embedded therein. An epoxy resin of low viscosity was impregnated into the

TABLE 1

| Sample No. | Average grain size in micron of insulating material ($SiO_2$) | Constituent of low viscosity resin | Impregnation property | Results of cycling temperature change test in aluminum casing |
|---|---|---|---|---|
| 1 | 44 | | poor | good |
| 2 | 61 | Resin: bisphenol type | good | good |
| 3 | 88 | epoxy resin | good | good |
| 4 | 149 | Hardener: methyl highmic | good | good |
| 5 | 177 | acid anhydride | good | good |
| 6 | 250 | Diluent: polypropylene | good | good |
| 7 | 350 | glycol | good | good |
| 8 | 500 | Viscosity: 600 – 800$^{cp}$ | good | good |
| 9 | 840 | | good | good |
| 10 | 1680 | | good | good |
| 11 | 2830 | | good | good |
| 12 | 3360 | | good | good |
| 13 | 4760 | | good | good |
| 14 | 5660 | Resin: " | good | poor (cracks appear after 4 cycles) |
| | | Hardener: " | | |
| 15 | conglomerated | Diluent: " | good | poor (cracks appear after 1 cycle) |
| | | Viscosity: " | | |

(Cycling temperature change test: One cycle consists of three steps of leaving samples for one hour at −65° C, leaving the samples for five minutes at room temperature and leaving the samples for one hour at 155° C)

TABLE 2

| Sample No. | Average grain size in micron of insulating material ($SiO_2$) | Constituent of low viscosity resin | Impregnation property | Results of cycling temperature change test in aluminum casing |
|---|---|---|---|---|
| 16 | 88 | Resin: bisphenol type epoxy resin | good | good |
| 17 | 149 | Hardener: aliphatic amine | good | good |
| 18 | 350 | | good | good |
| 19 | 500 | Diluent: polypropylene glycol Viscosity: 600 – 800$^{cp}$ | good | good |
| 20 | 2830 | | good | good |
| 21 | 4760 | | good | good |

(Cycling temperature change test: One cycle consists of three steps of leaving samples for one hour at −65° C, leaving the samples for five minutes at room temperature and leaving the samples for one hour at 155° C.)

It is seen that when the average grain size of the insulating materials is between 61 $\mu$ and 4760 $\mu$, the degree of impregnation of the resins of low viscosity is better and the results of the cycling temperature change tests were also better. Other insulating materials such as magneupper and lower layers. The degree of impregnation as well as the results of the samples subjected to the cycling temperature change tests were investigated. The results are shown in Table 3.

TABLE 3

| Sample No. | Average grain size in micron of insulating material ($SiO_2$) upper layer | Average grain size in micron of insulating material ($SiO_2$) lower layer | Constituent of low viscosity resin | Impregnation property | Results of cycling temperature change test in aluminum casing |
|---|---|---|---|---|---|
| 22 | 149 | 840 | | good | good |
| 23 | 177 | 840 | | good | good |
| 24 | 350 | 840 | Resin: bisphenol type epoxy resin | good | good |
| 25 | 840 | 149 | | good | good |
| 26 | 840 | 177 | Hardener: aliphatic amine | good | good |
| 27 | 840 | 350 | Diluent: polypropylene glycol | good | good |
| 28 | 350 | 2830 | | good | good |
| 29 | 500 | 2830 | Viscosity: 400 – 600$^{cp}$ | good | good |
| 30 | 840 | 2830 | | good | good |

(Cycling temperature change test: One cycle consists of three steps of leaving samples for one hour at −65° C, leaving the samples for five minutes at room temperature and leaving the samples for one hour at 155° C.)

It is seen that both the degree of impregnation and the results of the cycling temperature change tests were better even when the two layers of the insulating material, finely divided quartz SiO₂, of different grain sizes were formed. Furthermore, the degree of impregnation was improved and the impregnation time was reduced because of the two layers of the insulating material of different grain sizes. Other insulating material such as magnesium oxide MgO, ferric oxide Fe₂O₃, lead oxide PbO, hollow borosilicate soda glass and rubber were also tested. The results were quite satisfactory.

EXAMPLE 3

Finely divided quartz was charged so as to form three layers of different grain sizes. Electrical elements were embedded into an intermediate layer of finest grain sizes. The upper and lower layers had the grain sizes greater than that of the intermediate layer. An epoxy resin of low viscosity was impregnated into these layers. The results of the impregnation tests and the cycling temperature change tests are shown in Table 4.

SECOND EMBODIMENT, FIGS. 4 – 6

Figure 4:
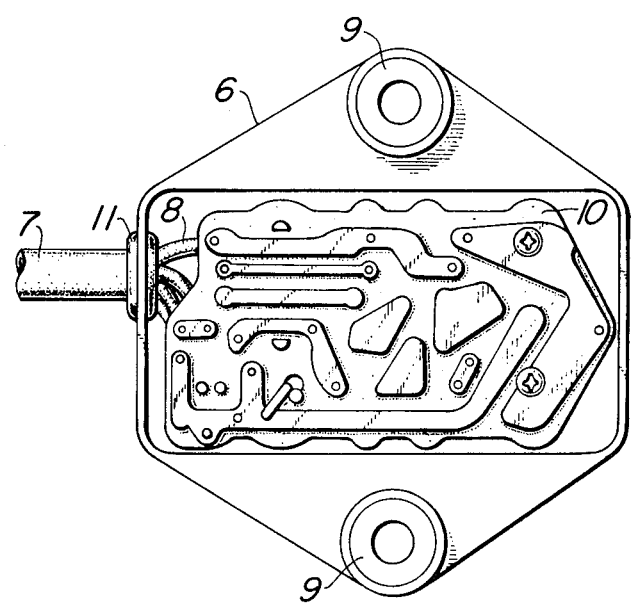
FIGS. 4 and 5 are a top and a sectional view, respectively, of an electrical component, i.e. semiconductor device of a condensor discharge type ignition device to be sealed with resin in accordance with the present invention.
Figure 5:
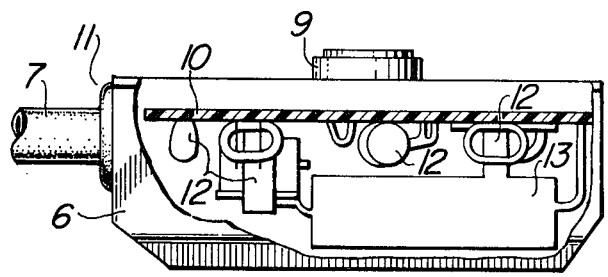
Figure 6:
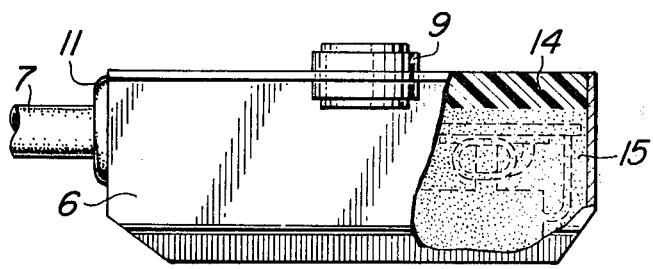
FIG. 6 is a sectional view thereof sealed in accordance with the present invention.

In the second embodiment shown in FIGS. 4 – 6, an electrical component, i.e., a semiconductor device (CD amplifier) for a condenser discharge type ignition device for use with a motor bicycle is sealed with resin. That is, the semiconductor device comprises, as best shown in FIGS. 4 and 5, an aluminum case 6, a lead wire cover 7, a lead wire 8, grommets 9, a printed circuit board 10, a rubber bush 11 for a lead wire, electrical circuit elements 12, a semiconductor circuit complete 13. As shown in FIG. 6, an insulator or insulating material 15 is charged into the aluminum case 6 so that the electrical elements 10, 12 and 13 are embedded into the layer of the insulating material. Thereafter, a resin of low viscosity is impregnated into the layer of the insulating material 15 and is poured into the aluminum case 6 so that a cover layer 14 may be formed over the free surface of the insulating material layer. Thus, the electrical component is sealed with the resin. As best shown in FIG. 6, the thickness of the cover layer 14 is smaller than that of the insulating material layer.

TABLE 4

| Sample No. | Average grain size in micron of insulating material (SiO₂) | | | Constituent of low viscosity resin | Impregnation property | Results of cycling temperature change test in aluminum casing |
|---|---|---|---|---|---|---|
| | upper layer | intermediate layer | lower layer | | | |
| 31 | 1680 | 88 | 350 | Resin: bisphenol type epoxy resin Hardener: aliphatic amine Diluent: polypropylene glycol Viscosity: 400 – 600 cp | good | good |
| 32 | 350 | 80 | 1680 | | good | good |
| 33 | 840 | 177 | 840 | | good | good |

(Cycling temperature change test: One cycle consists of three steps of leaving samples for one hour at −65° C, leaving the samples for five minutes at room temperature and leaving the samples for one hour at 155° C.)

It is seen that both the degree of impregnation and the results of the cycling temperature change tests were satisfactory even when the three layers of the insulating material, finely divided quartz SiO₂, of different grain sizes were formed. The impregnation time was also reduced. The results of the tests of other insulating material such as magnesium oxide MgO, ferric oxide Fe₂O₃, lead oxide PbO, hollow borosilicate soda glass and rubber were also satisfactory.

EXAMPLE 4

As an example of electrical devices, semiconductor devices (CD amplifiers) for condenser type ignition devices for outboard engines were sealed with resins according to the method of the present invention and the prior art methods. After the resin-sealed semiconductor devices underwent the moisture and vapor tests and the cycling temperature change tests, their electrical characteristics performance and appearances were investigated. The results are shown in Table 5.

TABLE 5

| A resin-sealed electrical device | Constituent of resin | Dampproof test | Appearance after cycling temperature change test | Electrical characteristics after cycling temperature change test | Synthetic decision |
|---|---|---|---|---|---|
| Prior Art 1 (CD amplifier for outboard engines) | Resin: polyurethane resin | good | cracks appear after one cycle | inoperable | poor |
| Prior Art 2 (CD amplifier for outboard engines) | Resin: flexible epoxy resin Hardener: amines | good | foaming and swelling after one cycle | inoperable | poor |
| Prior Art 3 (CD amplifier for outboard engines) | Resin: flexible epoxy resin mixed with silica (25 parts hundred epoxy resin) Hardener: acid anhydrides | good | cracks appear | inoperable | poor |
| Prior Art 4 (CD amplifier for outboard engines) | silicone rubber | poor | good | good in operation | poor |
| Electrical device according to the present invention (CD amplifier for outboard engines) Sample No. 34 | Resin: bisphenol A type epoxy resin Hardener: acid anhydride Insulating material: SiO₂ (grain size: 840μ) | good | good | good in operation | good |

TABLE 5-continued

| A resin-sealed electrical device | Constituent of resin | Dampproof test | Appearance after cycling temperature change test | Electrical characteristics after cycling temperature change test | Synthetic decision |
|---|---|---|---|---|---|
| Sample No. 35 | Resin: bisphenol A type epoxy resin<br>Hardener: acid anhydride<br>Insulating material: $SiO_2$<br>(grain size of upper layer: 840μ, grain size of lower layer: 2830μ) | good | good | good in operation | good |
| Sample No. 36 | Resin: bisphenol A type epoxy resin<br>Hardener: acid anhydride<br>Insulating material: $SiO_2$<br>grain size { upper layer: 1680μ, intermediate layer: 88μ, lower layer: 350μ } | good | good | good in operation | good |

(Dampproof test: Samples were left for 240 hours at humidity of 95 %)
(Cycling temperature change test: One cycle consists of three steps of leaving samples for one hour at −65° C, leaving the samples for five minutes at room temperature and leaving the samples for one hour at 155° C)

The results of the tests of the semiconductor devices sealed with resins in accordance with the present invention were quite satisfactory, and it has been found that they may be satisfactorily used in the outboard engines.

EXAMPLE 5

As an example of electrical devices, semiconductor devices (DC amplifiers) of the condenser discharge type ignition devices for snowmobile engines were sealed with various insulating materials and resins, and were subjected to the moisture and vapor tests and the cycling temperature change tests. The results are shown in Table 6.

The results were quite satisfactory, and it has been found that the semiconductor devices sealed with resins in accordance with the present invention may be satisfactorily used in the snowmobile engines.

EXAMPLE 6

As an example of electrical devices, non-contact voltage regulators for engines of agricultural machinery were sealed with various insulating materials and resins, and subjected to the moisture and vapor tests and the cycling temperature change tests. The results are shown in Table 7.

TABLE 6

| A resin-sealed electrical device | Constituent of low viscosity resin and insulating material | Dampproof test | Appearance after cycling temperature change test | Electrical characteristic after cycling temperature change test | Synthetic decision |
|---|---|---|---|---|---|
| Electrical device according to the present invention (CD amplifier for snow mobiles) Sample No. 37 | Resin: bisphenol type epoxy resin<br>Diluent: polypropylene glycol<br>Hardener: aliphatic amine<br>Insulating material: $SiO_2$ (grain size: 420μ) | good | good | good in operation | good |
| " Sample No. 38 | Resin: "<br>Diluent: "<br>Hardener: "<br>Insulating material: $SiO_2$ + $CaCO_3$ (30 parts hundred $SiO_2$) (grain size: 420μ) | good | good | good in operation | good |
| " Sample No. 39 | Resin: "<br>Diluent: "<br>Hardener: K61-B (amine)<br>Insulating material: $SiO_2$ (grain size: 420μ) | good | good | good in operation | good |
| " Sample No. 40 | Resin: "<br>Diluent: "<br>Hardener: aliphatic amine<br>Insulating material: $SiO_2$ + $CaCO_3$ (30 parts hundred $SiO_2$) (grain size: 420μ) | good | good | good in operation | good |
| " Sample No. 41 | Resin: urethane resin<br>Insulating material: $SiO_2$ (grain size: 420μ) | good | good | good in operation | good |

(Dampproof test: Samples were left for 240 hours at humidity of 95 %)
(Cycling temperature change test: One cycle consists of three steps of leaving samples for one hour at −65° C, leaving the samples for five minutes at the room temperature and leaving the samples for one hour at 155° C)

TABLE 7

| A resin-sealed electrical device | Constituent of low viscosity resin and insulating material | Dampproof test | Appearance after cycling temperature change test | Electrical characteristics after cycling temperature change test | Synthetic decision |
|---|---|---|---|---|---|
| Electrical device according to the present invention (non-contact voltage regulator for agricultural machinery) Sample No. 42 | Resin: bisphenol type epoxy resin<br>Diluent: polypropylene glycol<br>Hardener: acid anhydride (MHAC)<br>Insulating material: $SiO_2$ (grain size: 420μ) | good | good | good in operation | good |
| "<br>Sample No. 43 | Resin: "<br>Diluent: "<br>Hardener: aliphatic amine<br>Insulating material: $SiO_2$ + $CaCO_3$ (30 parts hundred $SiO_2$) (grain size: 420μ) | good | good | good in operation | good |
| "<br>Sample No. 44 | Resin: "<br>Diluent: "<br>Hardener: K61-B (amines)<br>Insulating material: $SiO_2$ (grain size: 420μ) | good | good | good in operation | good |

(Dampproof test: Samples were left for 240 hours at humidity of 95 %)
(Cycling temperature change test: One cycle consists of three steps of leaving samples for one hour at −65° C, leaving the samples for five minutes at room temperature and leaving the samples for one hour at 155° C)

The results were quite satisfactory, and it has been found that the semiconductor devices sealed with resins in accordance with the present invention may be satisfactorily used in agricultural machinery engines.

EXAMPLE 7

As an example of electrical device, semiconductor devices (CD amplifiers) of the condenser dischage type ignition devices for motor bicycle engines were sealed with various insulating materials and resins and subjected to the moisture and vapor tests and the cycling temperature change tests. The results are shown in Table 8.

As a result, it has been found that both the appearance and the electrical properties of the semiconductor devices sealed with resins are quite satisfactory.

EXAMPLE 8

As an example of electrical devices, semiconductor devices (CD amplifiers) of the condenser discharge type ignition devices for the snowmobile engines were sealed with hollow borosilicate soda glass, and subjected to the moisture and vapor tests and the cycling temperature change tests in order to investigate their electrical characteristics and appearance. The results are shown in Table 9.

TABLE 8

| A resin-sealed electrical device | Constituent of low viscosity resin and insulating material | Dampproof test | Appearance after cycling temperature change test | Electrical characteristics after cycling temperature change test | Synthetic decision |
|---|---|---|---|---|---|
| Electrical device according to present invention (CD amplifier for motor bicycles) Sample No. 45 | Resin: bisphenol type epoxy resin<br>Diluent: polypropylene glycol<br>Hardener: aliphatic amine<br>Insulating material: $SiO_2$ (grain size: 840μ) | good | good | good in operation | good |
| "<br>Sample No. 46 | Resin "<br>Diluent: "<br>Hardener: K61-B (amines)<br>Insulating material: " (grain size: 840μ) | good | good | good in operation | good |
| "<br>Sample No. 47 | Resin: "<br>Diluent: "<br>Hardener: "<br>Insulating material: $SiO_2$ + $CaCO_3$ (30 parts hundred $SiO_2$) (grain size: 840μ) | good | good | good in operation | good |

(Dampproof test: Samples were left for 240 hours at humidity of 95 %)
(Cycling temperature change test: One cycle consists of three steps of leaving samples for one hour at −65° C, leaving the samples for five minutes at room temperature and leaving the samples for one hour at 155° C)

TABLE 9

| A resin-sealed electrical device | Constituent of low viscosity resin and insulating material | Dampproof test | Appearance after cycling temperature change test | Electrical characteristics after cycling temperature change test | Synthetic decision |
|---|---|---|---|---|---|
| Electrical device according to the | Resin: bisphenol type epoxy resin | | | | |

TABLE 9-continued

| A resin-sealed electrical device | Constituent of low viscosity resin and insulating material | Dampproof test | Appearance after cycling temperature change test | Electrical characteristics after cycling temperature change test | Synthetic decision |
|---|---|---|---|---|---|
| present invention (CD amplifier for snow mobiles) Sample No. 48 | Diluent: polypropylene glycol Hardener: aliphatic amine Insulating material: hollow borosilicate soda glass (grain size: 65μ) | good | good | good in operation | good |
| " Sample No. 49 | Resin: " Diluent: " Hardener: " Insulating material: " (grain size: 840μ) | good | good | good in operation | good |

(Dampproof test: Samples were left for 240 hours at humidity of 95 %)
(Cycling temperature change test: One cycle consists of three steps of leaving samples for one hour at −65° C, leaving the samples for five minutes at room temperature and leaving the samples for one hour at 155° C)

As a result, it has been found that both the appearance and the electrical properties of the semiconductor devices sealed with resins are quite satisfactory even when hollow borosilicate soda glass is used as insulating material, and that such semiconductor devices may be practically used in the snowmobile engines.

EXAMPLE 9

As an example of electrical devices, semiconductor devices (CD amplifiers) of the condenser discharge type ignition devices for the snowmobile engines were sealed with the insulating material consisting of finely divided rubber, and were subjected to the moisture and vapor tests and the cycling temperature change tests in order to investigate the electrical characteristics and appearance after the tests. The results are shown in Table 10.

TABLE 10

| A resin-sealed electrical device | Constituent of low viscosity resin and insulating material | Dampproof test | Appearance after cycling temperature change test | Electrical characteristics after cycling temperature change test | Synthetic decision |
|---|---|---|---|---|---|
| Electrical device according to the present invention (CD amplifier for snow mobiles) Sample No. 50 | Resin: bisphenol type epoxy resin Diluent: polypropylene glycol Hardener: aliphatic amine Insulating material: natural rubber (grain size: 1000μ) | good | good | good in operation | good |
| " Sample No. 51 | Resin: " Diluent: " Hardener: " Insulating material: silicon rubber (grain size: 1000μ) | good | good | good in operation | good |

(Dampproof test: Samples were left for 240 hours at humidity of 95 %)
(Cycling temperature change test: One cycle consists of three steps of leaving samples for one hour at −65° C, leaving the samples for five minutes at room temperature, and leaving the samples for one hour at 155° C)

As a result, it has been found that both the electrical characteristics and the appearance of the semiconductor devices sealed with resins are quite satisfactory even when rubber is used as insulating material, and that such semiconductor devices may be practically used in the snowmobile engines.

What we claim is:

1. In a resin sealed electrical device comprising a case, a layer of finely divided insulating material and electrical elements both retained within said case and a resinous cover layer sealing said case,
   the improvement of providing a weather-resistant and shock-resistant device comprising using a finely divided insulating layer having a grain size between about 61 and 4760 microns in size, in combination with a low viscosity resin cover layer which resin is at least partially impregnated into the finely divided insulating layer securing and retaining the insulating layer within said case and forming a weather-resistant cover layer sealing said case and the insulating layer and electrical elements contained therein.

2. A resin-sealed electrical device according to claim 1, wherein said electrical elements are semiconductor parts of an amplifier for a condenser discharge type ignition device, and said resin of low viscosity is an epoxy type resin.

3. The weather-resistant resin-sealed electrical device of claim 1 wherein the case contains a plurality of insulating layers each such layer comprising finely pulverized quartz, magnesium oxide, ferric oxide, lead oxide, hollow borosilicate soda glass, rubber or mixtures thereof.

* * * * *